United States Patent [19]
Tsuchiya

[11] Patent Number: 5,412,671
[45] Date of Patent: May 2, 1995

[54] DATA PROTECTION AND ERROR CORRECTION, PARTICULARLY FOR GENERAL REGISTER SETS

[75] Inventor: Kenichi Tsuchiya, New Brighton, Minn.

[73] Assignee: Unisys Corporation, Blue Bell, Pa.

[21] Appl. No.: 37,155

[22] Filed: Mar. 25, 1993

Related U.S. Application Data

[63] Continuation of Ser. No. 621,146, Dec. 3, 1990, abandoned.

[51] Int. Cl.⁶ .............................................. G06F 11/10
[52] U.S. Cl. .................................. 371/51.1; 371/49.1; 371/49.2; 371/49.3
[58] Field of Search ............... 371/51.1, 49.1, 30, 371/40.2, 48, 70, 10.2, 49.2, 49.3

[56] References Cited

U.S. PATENT DOCUMENTS

| | | | |
|---|---|---|---|
| 3,340,506 | 9/1967 | Mayer | 371/70 |
| 4,224,681 | 9/1980 | Lewine | 371/49.1 |
| 4,271,519 | 6/1981 | Hall | 371/38 |
| 4,679,195 | 7/1987 | Dewey | 371/49.1 |
| 5,008,886 | 4/1991 | Chinnaswamy et al. | 371/40.2 |
| 5,140,597 | 8/1992 | Araki | 371/48 |

FOREIGN PATENT DOCUMENTS 1501173 8/1989 U.S.S.R.

*Primary Examiner*—Hoa T. Nguyen
*Attorney, Agent, or Firm*—Glenn W. Bowen; Mark T. Starr

[57] ABSTRACT

A data protection and correction scheme is implemented by providing main and shadow stores for groups of data bits from a segmented data word. The data bits are divided into even and odd address groups for storage into even and odd storage sections. Each group of 3 bits from a 36-bit data word is supplied in uncomplemented form to even and odd address main stores and in a complemented form to even and odd address shadow stores. By storing the complemented parity bit with the uncomplemented data and the uncomplemented parity bit with the complemented data, the odd parity of the input data is converted to an even parity which may be checked upon read-out from the main store. If this parity test fails, the shadow store is accessed to supply the correct data. When a write address and a read address attempt to access the same storage address a conflict is detected and input data and parity are directly supplied to an output multiplexor. In the preferred embodiment the data is supplied to the general register set of the receiving processor.

11 Claims, 2 Drawing Sheets

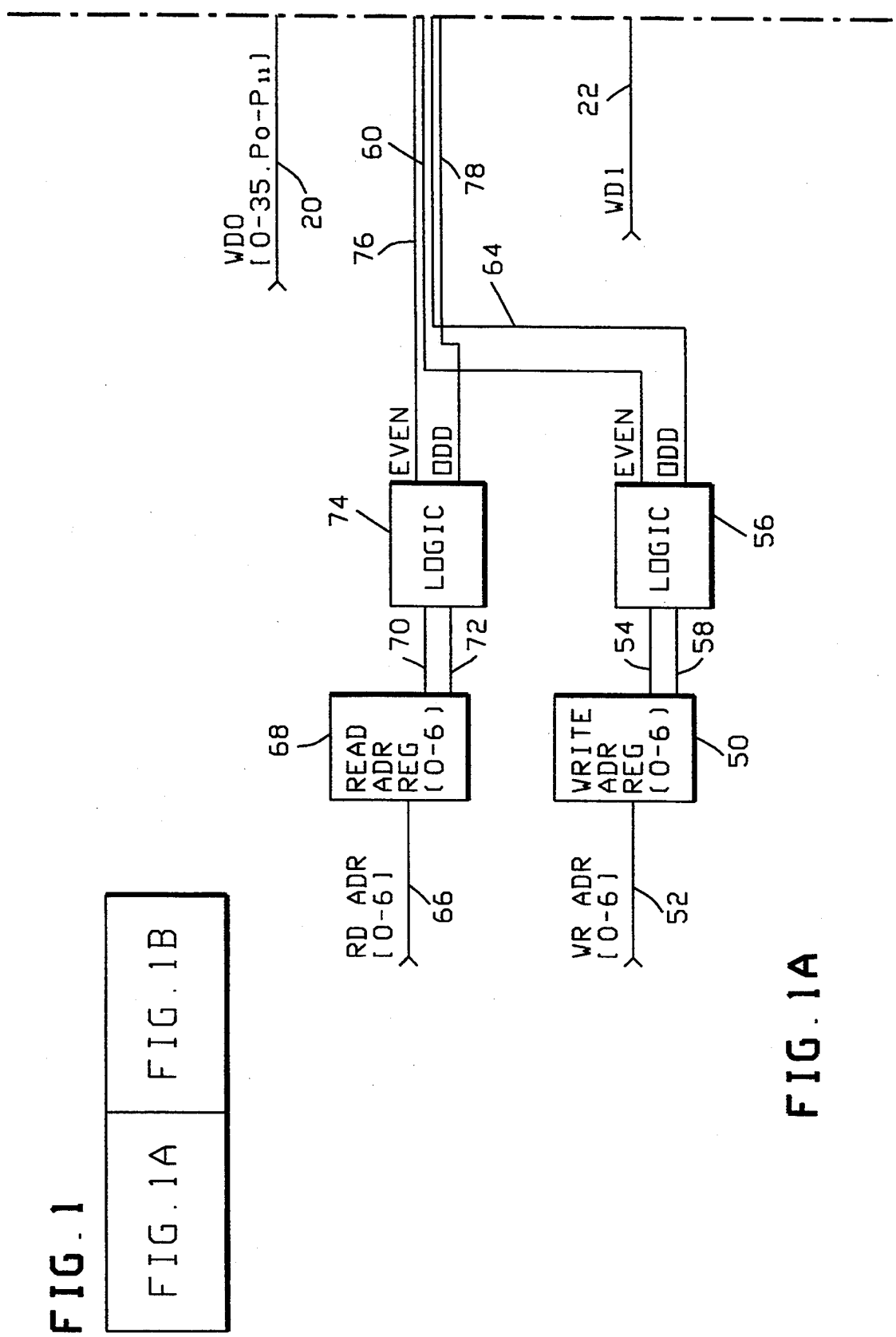

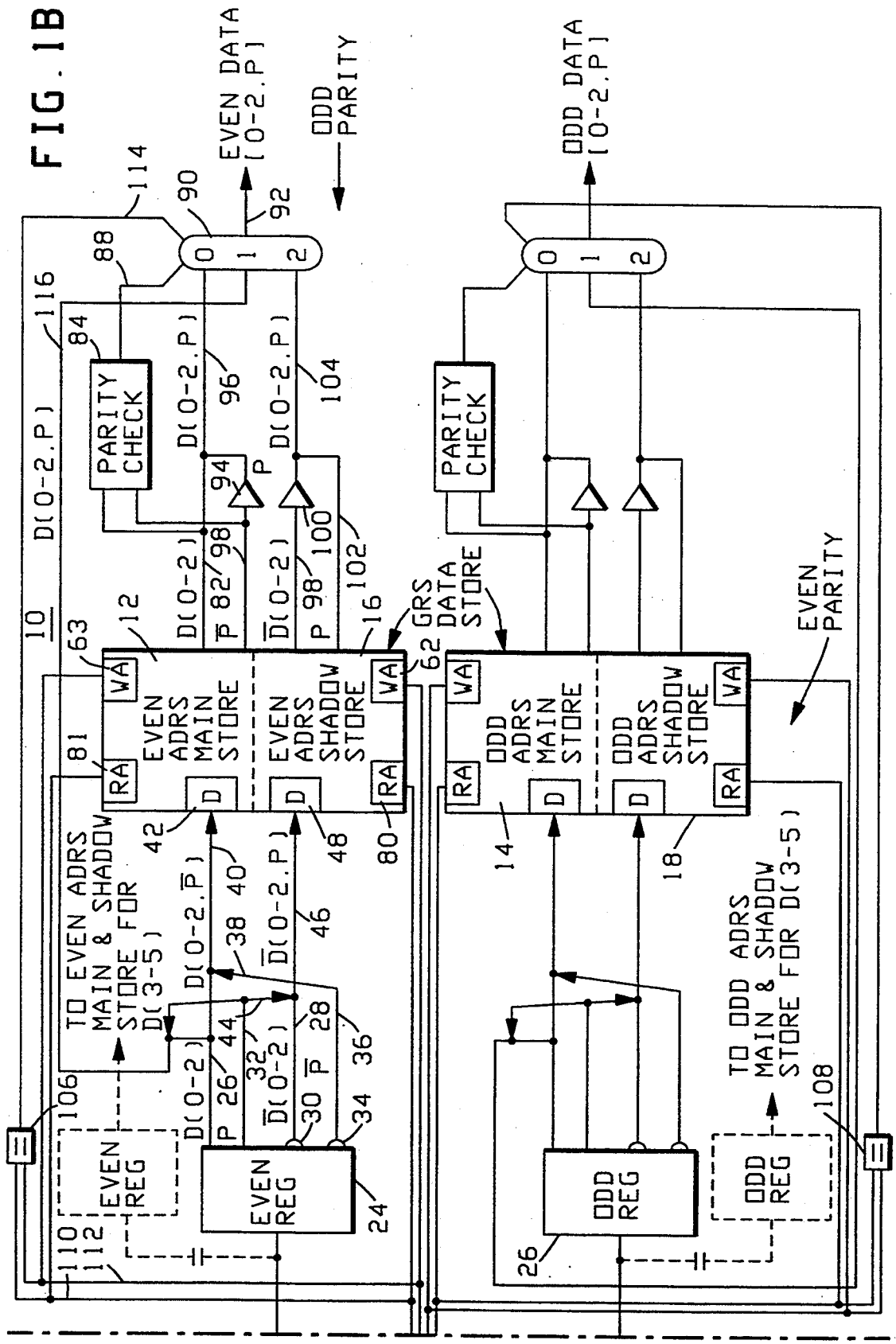

DATA PROTECTION AND ERROR CORRECTION, PARTICULARLY FOR GENERAL REGISTER SETS

This application is a continuation of application Ser. No. 07/621,146, filed Dec. 3, 1990, abandoned.

BACKGROUND OF THE INVENTION

1. Field of the Invention

This invention relates to the protection and recovery from errors in memory storage devices and, more particularly, to such protection and recovery in general register sets (GRS) used in instruction processors (IP).

2. Discussion of Background Art

As data processing systems become more complex and sophisticated, it is becoming even more critical to be able to detect and correct errors that may occur, particularly "soft" or temporary errors that may affect the numerous storage elements of such systems. Storage elements that need such protection and correction include large memory banks, high speed cache memories, storage registers, auxiliary memory storage elements, in fact any device which holds instructions or data needs effective data protection and correction techniques in modern computing systems.

General register sets for instruction processors are one of the key storage elements in modern computer systems that must have error detection and protection. These registers are used for different purposes. They may be used as accumulators, as index registers or as special data handlers. Partial word read and write capabilities, which necessitates segmentation of data words, are desirable, but this requires additional complexity in the design of general register sets and makes error correction and detection even more difficult. It is extremely important to protect the data in such registers and to provide for correction when errors occur. (Data as used in this document is intended to encompass binary representation of information in a broad sense to include instructions, addresses and operands.) Prior protection schemes are known which involved parity checking for error detection, but which did not allow for recovery after the errors were detected.

SUMMARY OF THE INVENTION

Memory, in particularly general register set, protection and error correction is provided for incoming data words that are segmented into groups of bits, each group of which is supplied from a source along with at least one parity bit of one type of priority (for example, an odd priority) to an input holding register. The holding register is coupled to a main store and a shadow store through circuits that supply the group of data bits and a complemented parity bit for storage in one of the stores, and a complemented group of data bits and the parity bit for storage in the other group of stores. Upon read-out, data is obtained from the main store and is checked for parity of the opposite type to the type supplied (for example, even parity). If the parity test is successful, the data bit group was obtained from this main store section and is supplied as an output. If the parity test fails, this data bit group is obtained from the shadow store and is supplied as the output. The system may be implemented to operate with an even and odd address scheme by duplicating the main and shadow stores and the other accompanying circuitry, and using one section for even address and the other dual section for odd address.

BRIEF DESCRIPTION OF THE DRAWINGS

FIG. 1 is a map that shows how FIGS. 1a and 1b should be aligned with respect to each other to form FIG. 2, and FIGS. 1a and 1b represent a block diagram which shows how the present invention is implemented in an embodiment in which the general register set is divided into even and odd address registers.

DETAILED DESCRIPTION OF THE INVENTION

FIGS. 1a and 1b show an implementation of the invention for use with a general register set that is divided into even and odd address registers. The invention may, if desired, alternately be implemented with an address scheme that does not use even or odd addressing techniques, as will be readily recognized by those skilled in the art. The basic features of the invention also may be implemented with storage devices in systems that do not include all of the features of the preferred general register set that is described herein, as will also be readily apparent to those skilled in the art. In FIGS. 1a and 1b a single line may be used to depict a number of lines. The instances where this is done will be made apparent in the following description.

The instruction processor of a computer includes a number of general registers that form a general register set. Currently advanced processors may include 128, or more, registers in their general register set. Referring to FIGS. 1a and 1b, the registers of the general register set of a processor which are addressed by even addresses are represented as the even address main store 12, while the general registers which are addressed by odd addresses are represented by the odd address main store 14 in FIG. 1b. The terms "main store" and "shadow store" are used in the specification, however, since the invention has broader uses than only for general register set implementation. In addition to the usual even and odd address main store, the present invention utilizes an even address shadow store 16 and an odd address shadow store 18. The shadow stores 16 and 18 contain complemented versions of data stored in the even address main store 12 and the odd address main store 14, respectively.

The described implementation is particularly adaptable for use with emitter coupled logic (ECL) technology, since ECL readily provides both complemented and uncomplemented logical output signals. A set of input lines, which are represented by the single line 20 that is labelled WD0, are the input lines for the general registers which are addressed with even addresses. Another set of input lines, which are represented by the single line 22 that is labelled WD1, are the input lines for general registers which are addressed with odd address. In the description that follows, the plural "lines" is used when a single line is shown on the drawing where that single line is intended to represent a plurality of lines in conformance to the description above.

In the illustrated embodiment input data from a source (not shown) on the lines 20 and 22 are provided in 36-bit words which contain data bits, (labelled (0-35) above line 20). These 36 bits are partitioned into 12 groups of 3 bits each to enable partial words with less than 3 bits to be used, as is common practice in high level machines. Each group of 3 bits is segmented and passed through a separate parity checker that provides a parity bit that is representative of the group. Thus, there are also 12 parity bits, which are labelled (P0–P11), for each output word D(0–35) that appears on either of the lines 20 or 22. These parity bits are read into the corresponding even input register 24 or the odd input register 26, according to whether an even or an odd general register is to be addressed.

The lower portions of FIGS. 1a and 1b depict odd address general register data error correction circuitry which is constructed in the same manner as the even address general register error correction circuitry that is shown in the upper portion of FIGS. 1a and 1b, which will be included when even/odd addressing is employed. Since the odd address circuitry duplicates the even address circuitry, an understanding of the operation of both sections will, therefore, be apparent from the following description which is directed to the even address error correction circuitry.

Assuming a general register with an even address has been accessed, the data bits D(0–35) and the parity bits (P0–P11) associated with the register are supplied to the lines 20 from the source. These bits are read from the even register 24 in groups of 3 data bits at a time on the lines 26. As indicated by the symbol D(0–2) above line 26, and are provided on the line 76 to the first register 24 stage of a group of even address registers. In FIG. 1b the register 24 is provided to hold data bits D(0–2) and the corresponding parity bit P0, which is labelled, P, in the figures. The dotted representation of the even register shown above the register 24 represents the second register stage that holds data bits D(3–5) and their corresponding parity bit. The other register stages for data bits (6–35) and their corresponding parity bits are not shown since the are all equivalent to register 24.

The logical complements of bits D(0–2) are supplied on the lines 28, as indicated by the symbol $\overline{D}(0-2)$, through logical inverters 30, which are represented by the semicircle, on the output of the even register 24. The parity bit P which is associated with the data bits D(0–2) on the lines 26 is supplied on the line 32 to the lines 38, 44. The inverse of the parity bit P which is provided by inversion of the bits P by the logical inverter 34 is supplied on the line 36 to the line 40.

The input parity bits on the lines 20, 22 from the source have an odd parity. It is desirable, however, that main and shadow store 12, 14, 16 and 18 be associated with an even parity. The reason for having an odd parity for incoming signals and an even parity for the storage sections is that upon power-up, a master clear will initialize storage sections 12–18 to a "0" state, which would indicate that an even parity existed in these sections. In order to provide for more complete error checking coverage following initialization, the input parity is, therefore, referenced to odd parity. The parity at the output of the circuit of FIG. 1b is also referenced to an odd parity so that it is consistent with the input parity.

To accommodate the change of parity from odd to even in the GRS data store sections 12–18, the complemented, or inverted, parity bit $\overline{P}$ on the line 36 is combined with data bits D(0–2) on the lines 26, and the combined bits are supplied on the lines 40 to the data input read drivers 42 of the even address main store 12. In a similar manner, the parity bits P on the line 32 is supplied on the line 44 and is combined with the complemented data signals, $\overline{D}(0-2)$, on the lines 28 which are then supplied on the lines 46 to the data input drivers 48 of the even address shadow store 16. Thus, the current status of an even address register which has been accessed will be stored in the even address main store 12 in groups of 3 data bits, along with the complemented parity bit that is associated with each group of 3 bits. At the same time, the complemented version of each of the 3-bit group will be supplied to the even address shadow store 16, along with the non-complemented parity bit $\overline{P}$ that is associated with this complemented group of 3 bits.

When the data bits D(0–2) are to be written into the even write register 50, the write address register 50 receives write address bits, WR ADR (0–6), on the lines 52. The write address bits 0–5 from the write address register 50 are provided on the lines 54 to a logic circuit 56, which controls the activation of one of the even and odd lines 60, 64 which are coupled to select one of the write amplifiers 63, 62 of the even address main and shadow stores 12, 16, or, alternately, those of the odd main and shadow stores 14, 18.

When it is desired to read from an even address store 12 or 16 in accordance with read address bits received by the read address register on the lines 66, the logic circuit 74 receives the read address bits 0–6 on lines 70 from the read address register 68 and controls the activation of one of the even and odd lines 76 and 78, which are coupled to select either the read amplifiers 81, 80 of the even address main and shadow stores 12, 16, or the read address amplifiers of the odd address main and shadow stores 14, 18. For example, if the even address data bits that were previously written into main and shadow store 12 and 16 are selected for read-out, the even selector line 76 will transmit a signal to the read address drivers 80, 81, to condition both the even address main store 12 and the even address shadow store 16 to be available for read-out.

The 36 data bits of the word that has been stored are then read out in groups of 3 data bits on the lines 82, as indicated by the symbol D(0–2), that represents the least significant group of bits that is read. As previously noted, one set of main and shadow storage sections are required for each group of 3 data bits or 12 sets are required, and only the main and shadow storage sections 12, 16 for the bits D(0–2) of even address words are shown since the discussion is applicable to the unshown circuits as well. The dotted line representations labelled "EVEN REG" and "ODD REG" in FIG. 1b are intended to represent the even and odd registers associated with the next group of 3 data bits D(3–5), which correspond to even register 24 and the odd register 26 for data bits D(0–2). The described portion of the system shown is repeated for bits D(3–5), and for each of the remaining 10 sets of data bit groups to implement an embodiment with a 36-bit data word that is segmented into 12 sections. Such segmentation in the described general register set environment is desirable to allow for partial word usage.

Each one of the 12 groups of 3 data bits is fed to its own separate parity checking circuit. Parity checker 84 is shown for even address words for data bits D(0–2) in FIG. 1b. The complemented parity bit, $\overline{P}$, that was stored in the main store 12 for each of the sets of data is also supplied on the line 98 to the parity checker 84. The parity checker 84 indicates if an acceptable even parity exists for the 3 data bits D(0–2) and the complemented parity bit $\overline{P}$ on the lines 82, 98. Similar parity checks are utilized for the odd stores 14, 18 and for each of the other 12 groups of 3 data bits each (not shown).

A selection line 88 to a multiplexer 90 directs that the "0" input terminal of the multiplexer be connected to the output lines 92 of the multiplexer when parity of the bits that are supplied to the parity checker 84 are of an even parity. The complemented parity bit, $\overline{P}$, on the line 98 is inverted by the inverter 94 and is combined with the 3 data bits D(0–2) on the lines 82, and then supplied on the lines 96 to the "0" input terminal of the multiplexer 90. In this manner, the output data bit group D(0–2) on the lines 92 is converted to an odd parity group.

In the event that the 3-bit data group D(0–2) fails its parity check, the line 88 will select the "2" input terminal rather than the "0" input terminal. When this happens, the data to the multiplexer then come from the even address shadow store. The complemented data bits $\overline{D}$(0–2) on the line 98 are provided by a group of inverters that are represented in the drawing by inverter 100 and combined with the uncomplemented parity bit, P, on the line 102. This combined set of bits is provided on the lines 104 and to the "2" input terminal of the multiplexer 90 so it can be supplied on the output lines 92 from this terminal.

Occasionally, there may be a conflict between the read address and write address request for the same address store. This conflict is resolved in the described embodiment by use of the comparator 106 for the even addresses and comparator 108 for the odd addresses. Even read addresses are supplied to the comparator 106 on the lines 110 and the even write address are supplied to the comparator 106 on the lines 112. When the signals on lines 110,112 match, an output signal on the line 114 is supplied to the multiplexer 90 which results in the connection of the lines 116 to the output lines 92 in order to output the uncomplemented data bits D(0–2) and the uncomplemented parity bit, P, on the lines 26 and 38, respectively, through the "1" input terminal of the multiplexer. The comparator 108 functions in a similar manner with respect to the odd addressing conflict situations. In this manner, when there is a read-/write address conflict, the write function will occur. At the same time, the input information bypasses the main and shadow stores of the affected group of input data bits, and parity bits are supplied directly to the multiplexer output lines 92.

A representative example of the operation of the data protection and recovery technique of the present invention is illustrated below. If it is assumed that input D(0–2) bits have binary values of 110, respectively, then the received odd parity bit, P, for the input data will be a 1. The complemented $\overline{D}$ bits (0–2) then are 001, and the complemented odd parity bit, $\overline{P}$, for the input data is a 0. Thus, the data bits D(0–2) plus the received complemented parity bit, $\overline{P}$, will be 1100, while complemented $\overline{D}$ bits (0–2) plus the uncomplemented parity bit, P, will be 0011. In other words, if there is no error, the parity checker 84 will confirm that there is an even parity for data read from the main store 12.

It is now assumed that an error occurs in the even address main store 12. For example, if data bit one is erroneously read as a "0" instead of a "1" the bits D(0–2) would indicate 010. Then the received D(0–2) bits plus the received complemented parity bit, $\overline{P}$, will be 0100, and this bit set will fail the even parity check conducted by the parity checker 84. However, if the inverted, or complemented, bits $\overline{D}$(0–2) had been properly written into the even address shadow store 16 along with the uncomplemented parity bits, P, then when the complemented data bits $\overline{D}$(0–2) are read out and combined with the parity bit P on the line 102, a 0101 output will be provided which has the correct even parity. The multiplexer will, therefore, pass on the correct data and parity bits to the output lines 92 through the "2" input terminal.

The error correction technique described above will also detect parity calculation errors when the correct data bits and complemented data bits have been stored in the main store 12 and the shadow store 16, respectively, but an erroneous parity bit has been read out. For example, assume the correct data bits D(0–2) 110 were stored along with an incorrect complemented parity bit $\overline{P}$. The complemented parity bit, $\overline{P}$, in the example above is thus a "1" instead of a "0". Then the shadow store bits D(0–2) when combined with the incorrect complemented parity bit, $\overline{P}$, results in a 1101 output. The parity checker 84 in this case will again indicate that the even parity check failed because of the erroneous complemented parity bit. In this instance the instruction processor will be stopped and support services are required.

I claim:

1. A data protection and correction means for a first store means, wherein said first store means is coupled to receive input data bits from a source that also supplies input parity bits, comprising,
    second store means,
    first complementing means that receives said input data bits and produces complemented input data bits,
    second complementing means that receives said input parity bits and produces complemented parity bits,
    first combining means for combining said complemented input data bits with said input parity bits to form a first combined bit set,
    second combining means for combining said input data bits with said complemented parity bits to form a second combined bit set,
    write means for writing said first combined bit set into one of said first and second store means and said second combined bit set into the other of said first and second store means,
    read means for reading from said first store means the one of said first or said second combined bit sets which is stored in said first store means,
    parity checking means coupled to said read means for receiving said combined bit set which is read from first store means which is constructed to attempt to verify the parity thereof,
    output means coupled to said first and second store means and to said parity checking means for outputting said combined bit set which is stored in said first store means if said parity checking means verifies that the parity of said combined bit set which was stored in said first store means is correct, and for outputting said combined bit set which is stored in said second store means if said parity checking means fails to verify that the parity of said combined bit set which was stored in said first store means was correct.

2. A data protection and correction means as claimed in claim 1 wherein said first and second store means are a general register set.

3. A data protection and correction means as claimed in claim 1 wherein said input data bits are sent as data woods of a predefined bit size and said data words are segmented into a plurality of sub-groups of bits of predefined bit sizes, said first and second store means are segmented into a plurality of storage sections in correspondence with said plurality of sub-groups of bits so that each of said storage sections stores one of said sub-groups of bits, and said parity checking means and said output means are segmented in a plurality of parity checking and output sections, respectively, so that each parity checking means and each output means corresponds to, and functions with, one of said storage sections.

4. A data protection and correction means as claimed in claim 3 wherein said first and second store means are a general register set.

5. A data protection and correction means as claimed in claim 1 wherein said input parity bits have an odd parity and said parity checking means checks for an even parity.

6. A data protection and correction means as claimed in claim 5 wherein said output means supplies output signals which have an odd parity.

7. A data protection and correction means as claimed in claim 6 wherein said input data bits are represented as even and odd address words in said first and second store means, and said first and second store means are divided into even and odd first and second store areas comprising address resolution means for writing said even and odd address words in to the appropriate one of said first and second store means.

8. A method of providing data protection and correction means for a first store means, wherein said first store means is coupled to receive input data bits and input parity bits from a source and a second store means is available, comprising, complementing said input data bits and input parity bits to produce complemented input bits and complemented parity bits, combining said complemented input data bits with said input parity bits to form a first combined bit set, combining said input data bits with said complemented parity bits to form a second combined bit set, supplying said first combined bit set to one of said first and second store means for storage therein and said second combined bit set to the other of said first and second storage means for storage therein, reading said one of said first of said second combined bit sets which is stored in said first store means therefrom, verifying the parity of said combined bit set that was read from said first store means, reading said other of said first or said second combined bit sets which are stored in said second store means therefrom if said parity bit of said combined bit set which was stored in said first store means is not verified, and outputting either said combined bit set which was stored in first store means if said parity of said combined bit set which was stored in said first store means is verified, or said combined bit set which was stored in said second store means if said parity of said combined bit set which was stored in said first store means is not verified.

9. A method as claimed in claim 8 wherein said input data bits represent even and odd address words in said first and second store means, and said first and second store means are divided into even and odd first and second store areas, comprising writing said even and odd address words into the appropriate one of said first and second store means.

10. A method as claimed in claim 8 wherein said input parity bits have an odd parity, comprising checking said parity for even parity.

11. A method as claimed in claim 10 comprising outputting signals which have an odd parity.

* * * * *